(12) United States Patent
Yu et al.

(10) Patent No.: US 7,322,004 B1
(45) Date of Patent: *Jan. 22, 2008

(54) EFFICIENT HIGH-SPEED REED-SOLOMON DECODER

(75) Inventors: Zhan Yu, Sunnyvale, CA (US); Weishi Feng, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/407,436

(22) Filed: Apr. 20, 2006

Related U.S. Application Data

(63) Continuation of application No. 10/305,091, filed on Nov. 26, 2002, now Pat. No. 7,051,267.

(60) Provisional application No. 60/370,644, filed on Apr. 8, 2002.

(51) Int. Cl.
  *H03M 13/00* (2006.01)
(52) U.S. Cl. ........................................ 714/784
(58) Field of Classification Search ................. 714/784
  See application file for complete search history.

(56) References Cited

U.S. PATENT DOCUMENTS

| | | | | |
|---|---|---|---|---|
| 6,092,233 A | 7/2000 | Yang | ........................... | 714/784 |
| 6,119,262 A | 9/2000 | Chang et al. | ................. | 714/781 |
| 6,122,766 A | 9/2000 | Fukuoka et al. | ............. | 714/784 |
| 6,209,115 B1 | 3/2001 | Truong et al. | ............... | 714/784 |
| 6,256,763 B1 | 7/2001 | Oh et al. | ..................... | 714/784 |
| 6,286,123 B1 | 9/2001 | Kim | ............................ | 714/781 |
| 6,317,858 B1 | 11/2001 | Cameron | ..................... | 714/785 |
| 6,347,389 B1 | 2/2002 | Boyer | ......................... | 714/784 |
| 6,374,384 B1 | 4/2002 | Ohta et al. | ................... | 714/784 |
| 6,378,104 B1 | 4/2002 | Okita | .......................... | 714/784 |
| 7,010,739 B1 | 3/2006 | Feng et al. | ................... | 714/784 |

FOREIGN PATENT DOCUMENTS

WO WO99/09694 2/1999

OTHER PUBLICATIONS

Chang et al., A Reed-Solomon Product-code (PS_PC) decoder chip for DVD Applications, Feb. 2001, IEEE Journal of Solid-State Circuits, vol. 36, No. 2, p. 229-237.*

(Continued)

*Primary Examiner*—Shelly Chase

(57) ABSTRACT

A Reed-Solomon decoder includes an inversionless Berlekamp-Massey algorithm (iBMA) circuit with a pipelined feedback loop. A first polynomial generator generates error locator polynomial values. A discrepancy generator generates discrepancy values based on the error locator polynomial values and the scratch polynomial values. Arithmetic units are used to generate the discrepancy values are also used to generate the error locator polynomial to reduce circuit area. A first delay circuit delays the discrepancy values. A feedback loop feeds back the delayed discrepancy values to the error locator polynomial generator. An error location finder circuit communicates with the iBMA circuit and identifies error locations. An error value computation circuit communicates with at least one of the error location finder circuit and the iBMA circuit and generates error values.

41 Claims, 11 Drawing Sheets

OTHER PUBLICATIONS

Song et al., Low energy software Reed-Solomon codecs using specialized finite filed data path and division-free Berlekamp-Massey algorithm, 1999, IEEE, p. I-84-I-89.*

Burton, Herbert O., Inversionless decoding of binary BCH codes, Jul. 1971, IEEE Trans. on Info. Theory, VOI. It-17, No. 4, p. 464-466.*

U.S. Appl. No. 60/371,898, filed Apr. 11, 2002, Feng et al.

Chien, "Cycle Decoding Procedures for Bose-Chaudhuri-Hocquenghem Codes", IEEE Transactions on Information Theory, Oct. 1964, pp. 357-363.

Elwyn R. Berlekamp, "Algebraic Coding Theory, Binary BHC Codes for Correcting Multiple Errors", 1968, pp. 176-196.

Ralf Koetter, "On the determination of error values for codes from a class of maximal curves", University of Illinois Coordinated Science Laboratory, Urbana, Illinois, pp. 44-53.

Truong/Jeng/Hung, "Inversionless Decoding of Both Errors and Erasures of Reed-Solomon Code", IEEE Transactions on Communications, vol. 46, No. 8, Aug. 1998, pp. 973-976.

Elwyn R. Berlekamp, "Algebraic Coding Theory, Binary BHC Codes for Correcting Multiple Errors", 1968, pp. 186-194.

Bose-Chaudhuri-Hocquenghme Codes, 7.5 Fast Decoding of BCH Codes, pp. 186-187.

Feng, On Decoding Reed-Solomon Codes Up To And Beyond The Packing Radii, Chapter 2, University of Illinois at Urbana-Champaign, 1999, pp. 7-32.

Forney, Jr., "On Decoding BCH Codes", IEEE Transactions on Information Theory, Vo. 11, No. 4, Oct. 1965, pp. 549-557.

Horiguchi, "High-Speed Decoding of BCH Codes Using a New Error-Evaluation Algorithm", Electronics and Communications in Japan, Part 3, vol. 72, No. 12, 1989, pp. 63-71.

Massey, "Shift-Register Synthesis and BCH Decoding", IEEE Transactions on Information Theory, vol. 15, No. 1, Jan. 1969, pp. 122-127.

Truong/Jeng/Hung, "Inversionless Decoding of Both Errors and Erasures of Reed-Solomon Code", IEEE Transactions on Communications, vol. 46, No. 8, Aug. 1998, pp. 2-5.

Reed et al., VLSI design of inverse-free Berlekamp Massey algorithm, Sep. 1991, IEE Proceedings-E, vol. 138, No. 5, p. 295-298.

Xu, Youzhi, Implementation of Berlekamp Massey algorithm without inversion, Jun. 1991, IEE Proceedings-I vol. 138. No. 3, p. 138-140.

Sarwate et al., High speed architecture for Reed Solomon decoders, Oct. 2001, IEEE Trans. on VLSI Sys., vol. 9, No. 5, p. 641-655.

* cited by examiner

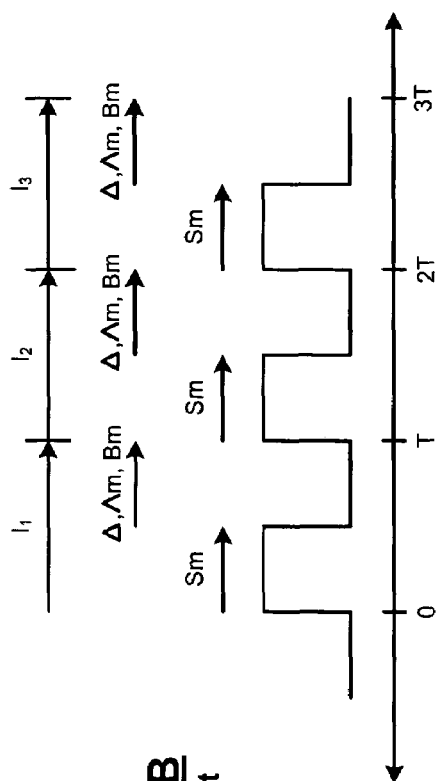
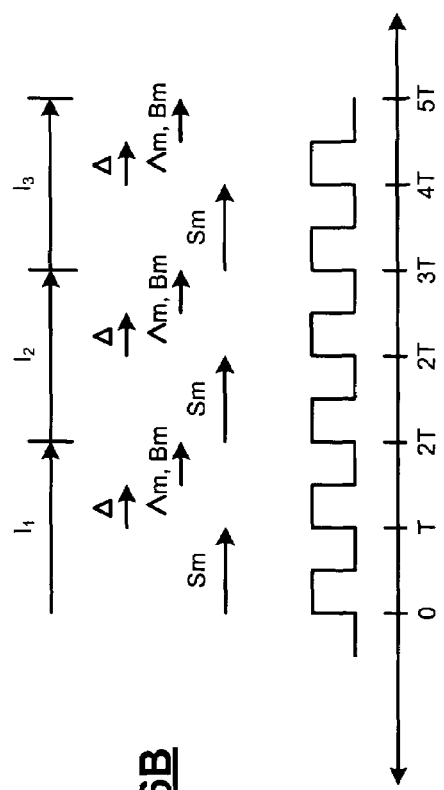
FIG. 5B
Prior Art
FIG. 6B

EFFICIENT HIGH-SPEED REED-SOLOMON DECODER

CROSS-REFERENCE TO RELATED APPLICATIONS

This application is a continuation of U.S. patent application Ser. No. 10/305,091 filed on Nov. 26, 2002 now U.S. Pat. No. 7,051,267, which application claims the benefit of U.S. Provisional Application No. 60/370,644, filed on Apr. 8, 2002. The disclosures of the above applications are incorporated herein by reference.

FIELD OF THE INVENTION

The present invention relates to forward error correction, and more particularly to Reed-Solomon decoders.

BACKGROUND OF THE INVENTION

As data storage densities and data transmission rates increase, the ability of hardware devices to correctly recognize binary data diminishes. To ensure data integrity, an error correcting Reed-Solomon (RS) code is often used. Many communications systems perform forward error correction (FEC) to improve data transmission accuracy and to ensure data integrity. FEC helps reduce bit error rates (BER) in applications such as data storage, digital video broadcasts, and wireless communications. Reed-Solomon (RS) error-correcting codes are commonly used for FEC.

Referring now to FIG. 1, a first device 10-1 communicates with a second device 10-2 over a communications channel 12. The communications channel can be hardwired or wireless. For example, the communications channel 12 can be an Ethernet network, a wireless local area network, a bus for a hard drive, etc. The first device 10-1 includes components 14-1 that output signals to a RS encoder 16-1 and that receive signals from a RS decoder 18-1. Likewise, the device 10-2 includes components 14-2 that output signals to a RS encoder 16-2 and that receive signals from a RS decoder 18-2. The components 14-1 of the first device 10-1 may be similar to or different than the components 14-2 of the second device 10-2. The encoders 16 encode the data before the data is output onto the communications channel 12. The encoders 16 insert redundant bits into the data stream. The decoders 18 use the redundant bits to detect and, when possible, to correct errors in the received data.

Referring now to FIG. 2A, steps that are performed by a RS decoder are shown generally at 20. In step 22, the RS decoder computes syndrome values. In step 24, the RS decoder computes an error locator polynomial. The error locator polynomial can be calculated using a Berlekamp-Massey algorithm (BMA), inversionless BMA (iBMA), Euclidean algorithm, or other suitable algorithms. In step 26, the Reed-Solomon decoder calculates an error evaluator polynomial, which is typically based on the syndrome values and the error locator polynomial.

In step 28, the RS decoder finds error locations. For example, Chien's search algorithm, which will be described below, can be used. In step 30, error values are found. For example, Forney's algorithm, which will be described below, is often used to find the error values. Steps 28 and 30 may be performed in parallel in hardware implementations.

Referring now to FIG. 2B, a RS decoder 32 typically includes a syndrome calculator 34 and an error locator polynomial generator 36, which employs Euclidean, Berlekamp-Massey or other algorithms. The RS decoder 32 also includes an error evaluator polynomial generator 38, an error location finder 40 and a error value finder 42. Control devices 44 and storage devices 46 may also be used to control decoding and to store data values for use by the RS decoder 32. The RS decoder 32 can be implemented using register-based VLSI, software and a processor, an application specific integrated circuit (ASIC) or in any other suitable manner.

The error location search can be performed using Chien's search, which is disclosed in R. T. Chien, "Cyclic Decoding Procedure for the Bose-Chandhuri-Hocquenghem Codes", I.E.E.E. Transactions on Information Theory, Vol. IT-10, pp. 357-363, October 1964, which is hereby incorporated by reference in its entirety. The error value computation can be performed using Forney's algorithm disclosed in G. D. Forney, "On Decoding BCH Codes", I.E.E.E Transactions on Information Theory, Vol. IT-11, pp. 549-557, October 1965, which is hereby incorporated by reference in its entirety.

While a data storage system will be used below to illustrate the operation of a Reed-Solomon decoder, skilled artisans will appreciate that there are may other uses for Reed-Solomon decoders. In the data storage system illustrated in FIG. 3, the Reed-Solomon decoder 32 receives sequential sectors or codewords 50-1, 50-2, 50-3 . . . , and 50-$n$. While the first codeword 50-1 is received, the Reed-Solomon decoder 32 computes the syndrome values for the first codeword 50-1 as shown at 52. While the second codeword 50-2 is received, the Reed-Solomon decoder 32 computes the error locator polynomial and then performs error location search and error value computations for the first codeword 50-1 as shown at 54. While the second codeword 50-2 is received, the Reed-Solomon decoder 32 also computes the syndrome values for the second codeword 50-2 as shown at 55. Operation continues in this manner for subsequent codewords.

The syndrome computation for an $n^{th}$ codeword must be completed by the end of the $n^{th}$ codeword. The error location search and error value computations for the $n^{th}$ codeword must be completed by the end of the $(n+1)^{th}$ codeword. The syndrome computation operates under the symbol clock $f_{symbol}$. The error location search and error value computations operate under a system clock $f_{system}$.

The Reed-Solomon decoder 32 operates based on finite fields $GF(2^m)$ where each symbol is an m-bit binary symbol $\epsilon GF(2^m)$. A Reed-Solomon code with correcting power t has a generator polynomial $G(x)$ over $GF(2^m)$ with 2t roots:

$$G(x)=(x+a^b) \ldots (x+a^{b+2t-2})(x+a^{b+2t-1})$$

$$G(x)=x^{2t}+g_{2t-1}x^{2t-1}+\ldots+g_1x^1+g_0x^0.$$

where $g_r \epsilon GF(2^m)$. A Reed-Solomon code word can be represented using polynomial $C(x)$:

$$C(x)=c_{n-1}x^{n-1}+\ldots+c_1x^1+c_0x^0$$

$$C(x)=x^{2t}(d_{k-1}x^{k-1}+\ldots+d_0x^0)+(r_{2t-1}x^{2t-1}+\ldots+r_0x^0)$$

$$C(x)=x^{2t}D(x)+R(x).$$

where $D(x)$ represents the data symbols to be encoded and $R(x)$ represents the Reed-Solomon parity symbols. The received code word can be represented using polynomial $V(x)$:

$$V(x)=v_{n-1}x^{n-1}+\ldots+v_1x^1+v_0x^0$$

$$V(x)=(c_{n-1}x^{n-1}+\ldots+c_0x^0)+(e_{n-1}x^{n-1}+\ldots+e_0x^0)$$

$$V(x)=C(x)+E(x).$$

where $C(x)$ is the polynomial representing the Reed-Solomon codeword and $E(x)$ is a polynomial representing the error vector.

During the decoding of a Reed-Solomon code, a set of 2t syndromes $S_0, S_1, \ldots, S_{2t-1}$ is first computed as shown in step 22 of FIG. 2A by evaluating V(x) at $\alpha^i$:

$$S_j = \sum_{i=0}^{n-1} V(\alpha^{i(b+j)}) = \sum_{i=0}^{n-1} v_i \alpha^{i(b+j)}.$$

Next, in step 24 of FIG. 2A, an error locator polynomial $\Lambda(x)$ of degree t is computed from the syndromes $S_0, S_1, \ldots, S_{2t-1}$. For example, an inversion-less Berlekamp-Massey algorithm (iBMA) is typically employed, although other algorithms can be used. Further details concerning the iBMA approach can be found in "Inversionless Decoding of Both Errors and Erasures of Reed-Solomon Code", I.E.E.E. Transactions on Communications, Vol. 46, No. 8, August 1998), which is hereby incorporated by reference in its entirety. A scratch polynomial B(x) of degree 2t is also used in the iBMA computation.

Referring now to FIG. 4, steps of the iBMA algorithm are shown. In step 56, initialization of the error locator polynomial ($\Lambda(x)=1$), the scratch polynomial (B(x)=1), indexes (r=0, L=0) and previous discrepancy ($\Delta_B=1$) is performed. If r=2t, as determined in step 57, control ends in step 58. Otherwise the discrepancy $\Delta$ is computed in step 60:

$$\Delta = \sum_{i=0}^{L} \Lambda_i S_{r-i}$$

Next, $\Lambda(x)$, B(x), L and $\Delta_B$ are updated according to rules in box 62. If $\Delta \neq 0$ as determined in step 64, $\Lambda(x)$ is set equal to $\Delta_B \Lambda(x) + \Delta_x B(x)$ in step 66. Otherwise, $\Lambda(x)$ is set equal to $\Lambda(x)$ in step 68. If $\Delta \neq 0$ and $2L \leq r$ as determined in step 72, B(x) is set equal to $\Lambda(x)$, L is set equal to r+1−L, and $\Delta_B$ is set equal to $\Delta$ in step 74. Otherwise, B(x) is set equal to xB(x) in step 76. In step 80, r is incremented. Control loops from step 80 to step 57.

To find the error locations, a search algorithm such as Chien's search is used to evaluate $\Lambda(x)$ at 1, $\alpha^{-1}$, $\alpha^{-2}, \ldots, \alpha^{-(n-1)}$, where $\Lambda(a^{-i})=0$ implies $v_i$ is a symbol with error. For error value computation, Forney's algorithm is typically used to compute error values at $\alpha^{-i}$, where $\Lambda(a^{-i})=0$. An error evaluator polynomial is defined by $\Omega(x) = \Lambda(x) S(x) \bmod x^{2t}$, where S(x) is the syndrome polynomial. Then, the error value at location $\alpha^{-i}$ is given by:

$$\frac{x^b \Omega(x)}{x \Lambda'(x)}$$

wherein $\Lambda'(x)$ is a formal derivative of $\Lambda(x)$.

A parallel architecture can be used for the iBMA algorithm implementation. Referring now to FIG. 5A, an iBMA circuit 100 for implementing the iBMA with t=3 is shown. As can be appreciated, t can have higher or lower values. The iBMA circuit 100 includes delay devices 102 (such as registers), finite field adders 104, and finite field multipliers 106.

The discrepancy value A is computed by multiplying syndromes $S_0, S_1, \ldots, S_5$ with the error locator polynomial coefficients $\Lambda_0, \Lambda_1, \Lambda_2,$ and $\Lambda_3$, respectively, using multipliers $S_{m0}, S_{m1}, S_{m2},$ and $S_{m3}$, respectively. Outputs of multipliers $S_{m0}$ and $S_{m2}$ are summed by adder 110 to provide an even portion of $\Delta_{even}$ discrepancy $\Delta$. Outputs of multipliers $S_{m1}$ and $S_{m3}$ are summed by adder 112 to provide an odd portion of $\Delta_{odd}$ discrepancy $\Delta$. (Such a separation of $\Delta_{even}$ and $\Delta_{odd}$ is because of the hardware reuse of iBMA and error evaluation circuit. $\Delta_{odd}$ is used in the evaluation of $x\Lambda'(x)$ in the Feng or Forney method.) $\Delta_{even}$ and $\Delta_{odd}$ are summed by adder 114 to provide discrepancy $\Delta$, which is fed back to multipliers $B_{m0}, B_{m1}, B_{m2},$ and $B_{m3}$.

Discrepancy $\Delta$ is also fed back through delay device 116 to conditionally update the value of the previous discrepancy $\Delta_B$. $\Delta_B$ is fed to the inputs of multipliers $\Delta_{m0}, \Delta_{m1}, \Delta_{m2},$ and $\Delta_{m3}$. Multipliers $B_{m0}, \ldots, B_{m3}$ and $\Delta_{m0}, \ldots, \Delta_{m3}$ are used in the computation of the updated value of $\Lambda(x)$ according to FIG. 4, step 66. A condition circuit 116 tracks index variables L, r and the discrepancy value $\Delta$ to determine the updated $\Lambda(x)$ and B(x) values according to FIG. 4 steps 64 and 72.

FIG. 5B shows the computation schedule of the iBMA of the iBMA algorithm using the circuit in FIG. 5A, where each iBMA iteration is finished within one clock cycle. In a first half of the clock cycle of a first iteration, syndrome values are calculated. In a second half of the clock cycle of the first iteration, the syndrome values are used to generate error locations and to compute error values. The critical path is the feedback loop within the iBMA iterations. In each iBMA iteration, the critical path involves the computation of the discrepancy value $\Delta$ followed by the computation of $\Lambda(x)$ and B(x). As the clock speed increases, it has become more difficult to complete one iBMA iteration within one clock cycle.

SUMMARY OF THE INVENTION

A Reed-Solomon decoder includes an inversionless Berlekamp-Massey algorithm (iBMA) circuit with a first polynomial generator that generates an error locator polynomial. A discrepancy generator generates discrepancy values based on the error locator polynomial. Arithmetic units used by the error locator polynomial generator are also used by the discrepancy generator of the iBMA circuit to reduce circuit area.

In other features, a syndrome calculating circuit generates syndromes that are output to the iBMA circuit. An error location finder circuit communicates with the iBMA circuit and that identifies error locations. The error location finder circuit can implement Chien's search.

In other features, an error value computation circuit communicates with the iBMA circuit and that generates error values. The error value computation circuit implements one of Forney's and Feng's algorithm. The iBMA circuit completes one iteration every two clock cycles.

In still other features, a second delay circuit communicates with an output of a scratch polynomial generator that generates a scratch polynomial. The discrepancy generator calculates discrepancy values over two clock cycles.

In still other features, a first delay circuit delays the discrepancy values. A feedback loop feeds back the delayed discrepancy values to the error locator polynomial generator and the scratch polynomial generator. The iBMA circuit is integrated with at least one of the error location finder circuit and the error value computation circuit.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5B illustrates the timing of the iBMA circuit of FIG. 5A;

FIG. 6B illustrates the timing of the iBMA circuit of FIG. 6A;

DETAILED DESCRIPTION OF THE PREFERRED EMBODIMENTS

Figure 1:
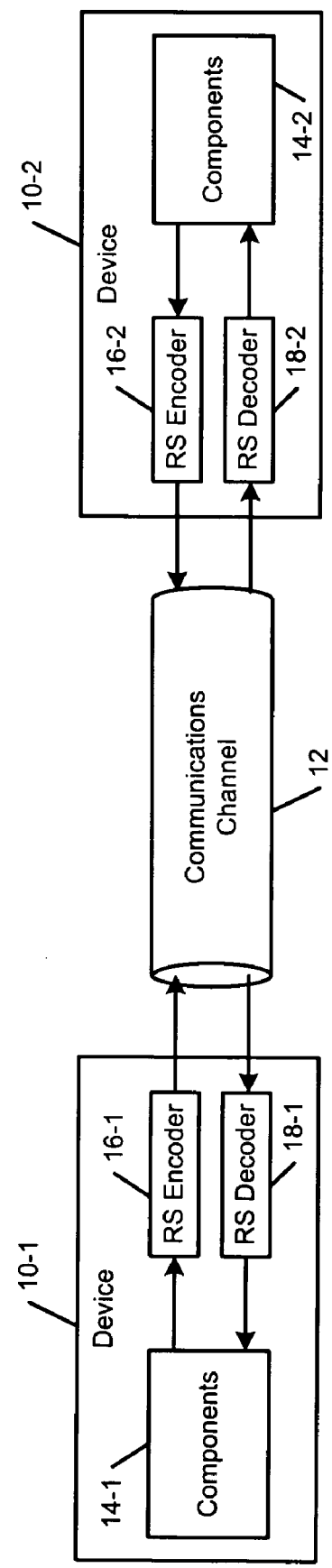
FIG. 1 is a functional block diagram of first and second devices that include RS encoders/decoders according to the prior art.

The following description of the preferred embodiment(s) is merely exemplary in nature and is in no way intended to limit the invention, its application, or uses. For purposes of clarity, the same reference numbers will be used in the drawings to identify similar elements.

The present invention provides an efficient and high-speed Reed-Solomon decoder. Higher speeds are achieved by pipelining the feedback loop in the BMA circuit one or more times. Circuit area is reduced by hardware sharing between the iBMA pipelines and hardware sharing between the iBMA, the error location finder and the error value computation circuit.

Figure 6A:
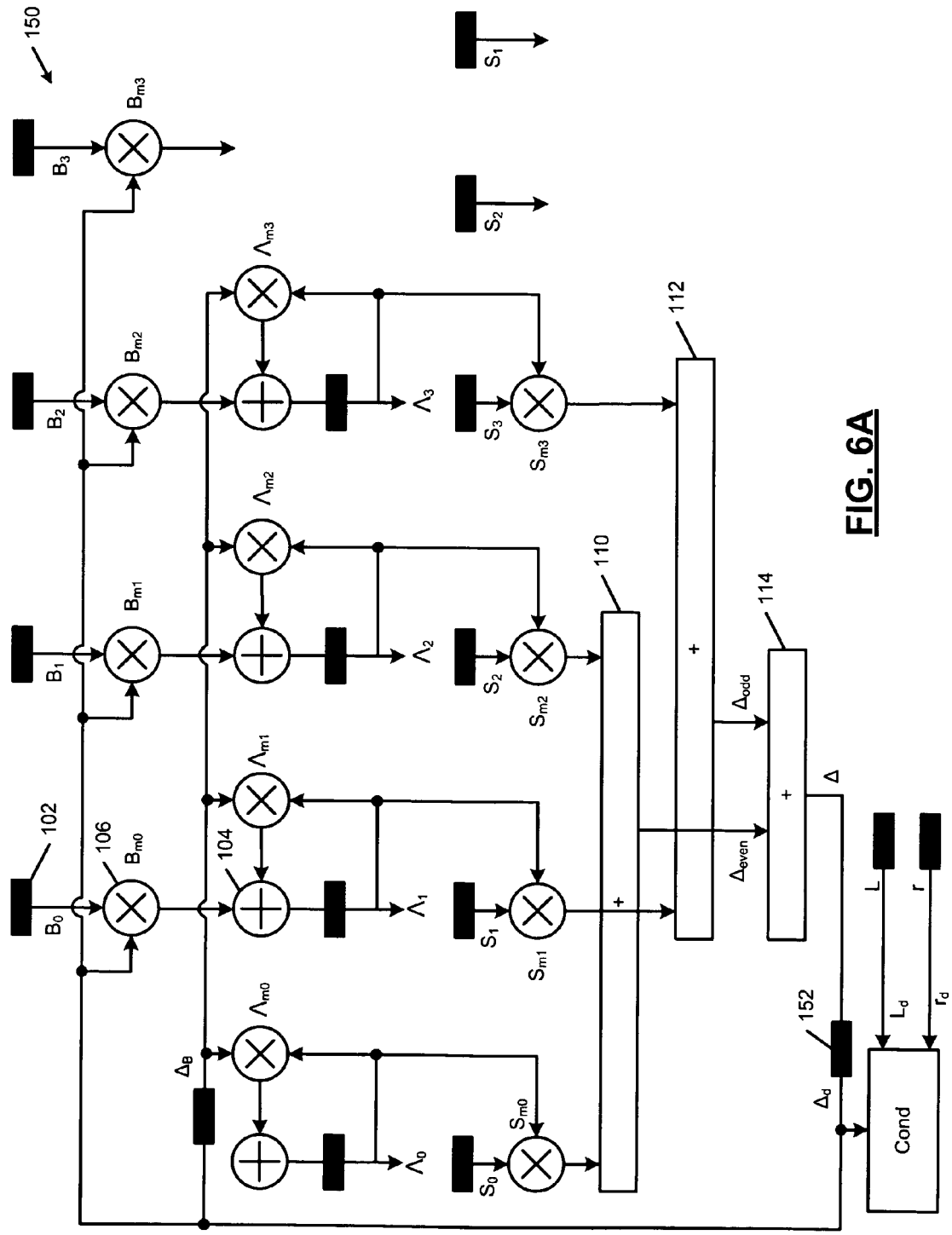
FIG. 6A is an electrical schematic of an iBMA circuit for a Reed-Solomon decoder according to the present invention with a pipelined feedback loop.

Referring now to FIG. 6A, an improved iBMA circuit 150 is shown. Normally, a critical path in a feedback loop cannot be reduced using pipelining. For the iBMA circuit 150, however, the input signals to the circuit 150 (the syndromes $S_0, \ldots, S_5$) are only taken as the initial value of the iBMA algorithm. Once the iBMA iteration starts, the iBMA circuit 150 no longer depends on outside input values. The iBMA circuit 150 according to the present invention includes a pipelined feedback loop. In other words, one or more delay devices such as registers or SR latches are inserted in the feedback loop.

In the exemplary implementation, a register 152 is positioned at the output of the adder 114. The register 152 outputs $\Delta_d$, which is a delayed discrepancy value. Instead of completing one iBMA iteration per clock cycle, two clock cycles are required for each iBMA iteration.

Referring now to FIGS. 6A and 6B, for each iBMA iteration, the discrepancy $\Delta$ is calculated during a first clock cycle. The register 152 changes value at the end of the first clock cycle. During the second clock cycle, $\Lambda(x)$ and $B(x)$ are calculated and updated. The discrepancy $\Delta$ maintains the same value during the second clock cycle. In other words, two clock cycles are required for each iBMA iteration. However, the critical path in the feedback loop is reduced, which allows the iBMA circuit 150 to run at faster clock speeds. The pipeline position is not limited to the output of the adder 114. Other suitable locations to pipeline the feedback loop include any position between the outputs of the multipliers $S_{m0}, \ldots, S_{m3}$ and the output of the adder 114.

Figure 7:
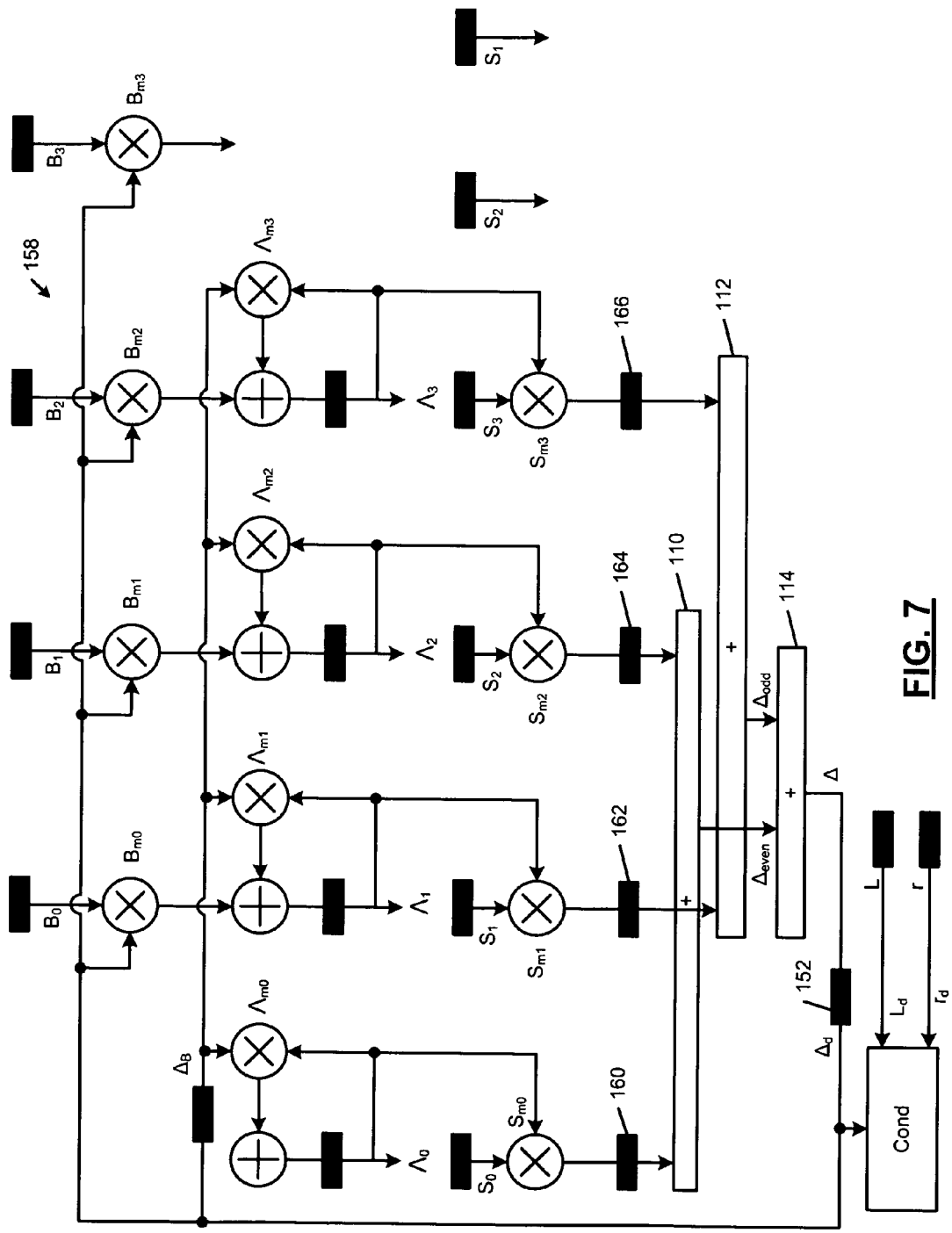
FIG. 7 is an electrical schematic of an iBMA circuit for a Reed-Solomon decoder according to the present invention with additional pipelining of the feedback loop.

Additional increases in clock speeds can be achieved by further pipelining the feedback loop. For example, the discrepancy $\Delta$ computation can be broken into two steps and three clock cycles can be used to complete each iBMA iteration. FIG. 7 illustrates an iBMA circuit 158 with additional pipelining. The iBMA circuit 158 includes additional delay devices 160, 162, 164, and 166 (such as registers) that are inserted between multipliers $S_{m0}, S_{m1}, S_{m2}$ and $S_{m3}$ and adders 110 and 112. The positions of the registers 160, 162, 164 and 166 can be moved between the output of the adder 114 and the outputs of the multipliers $S_{m0}, S_{m1}, S_{m2}$ and $S_{m3}$ according to the actual speed requirement.

Figure 8:
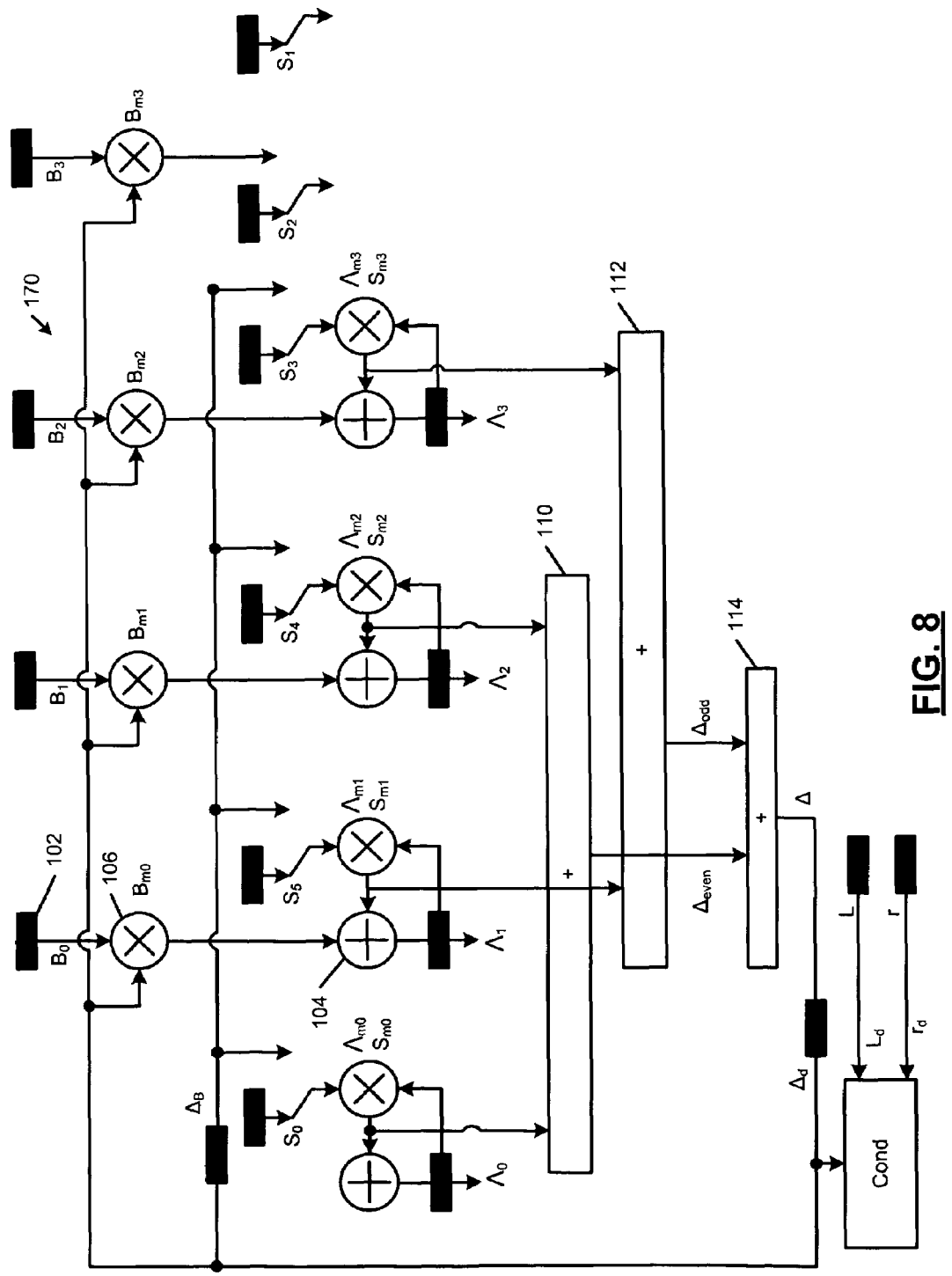
FIG. 8 is an electrical schematic of an iBMA circuit for a Reed-Solomon decoder according to the present invention with shared circuit elements such as multipliers.

After pipelining the feedback loop as taught in FIGS. 6A, 6B, and 7, some hardware resources are used in one clock cycle within one iBMA iteration and not other clock cycles. In FIG. 6A, the multipliers $S_{m0}, S_{m1}, S_{m2}$ and $S_{m3}$ are used during the first clock cycle. Multipliers $\Lambda_{m0}, \Lambda_{m1}, \Lambda_{m2}$, and $\Lambda_{m3}$ and $B_{m0}, B_{m1}$, and $B_{m2}$ are idle during the first clock cycle. Resource sharing can be used to reduce the circuit area of the iBMA circuits 150 and 158. $S_{m0}, S_{m1}, S_{m2}$ and $S_{m3}$ can be shared with multipliers $\Lambda_{m0}, \Lambda_{m1}, \Lambda_{m2}$, and $\Lambda_{m3}$ as shown in an iBMA circuit 170 in FIG. 8. As can be appreciated, similar techniques can be applied to the iBMA circuit 158 shown in FIG. 7.

Figure 2B:
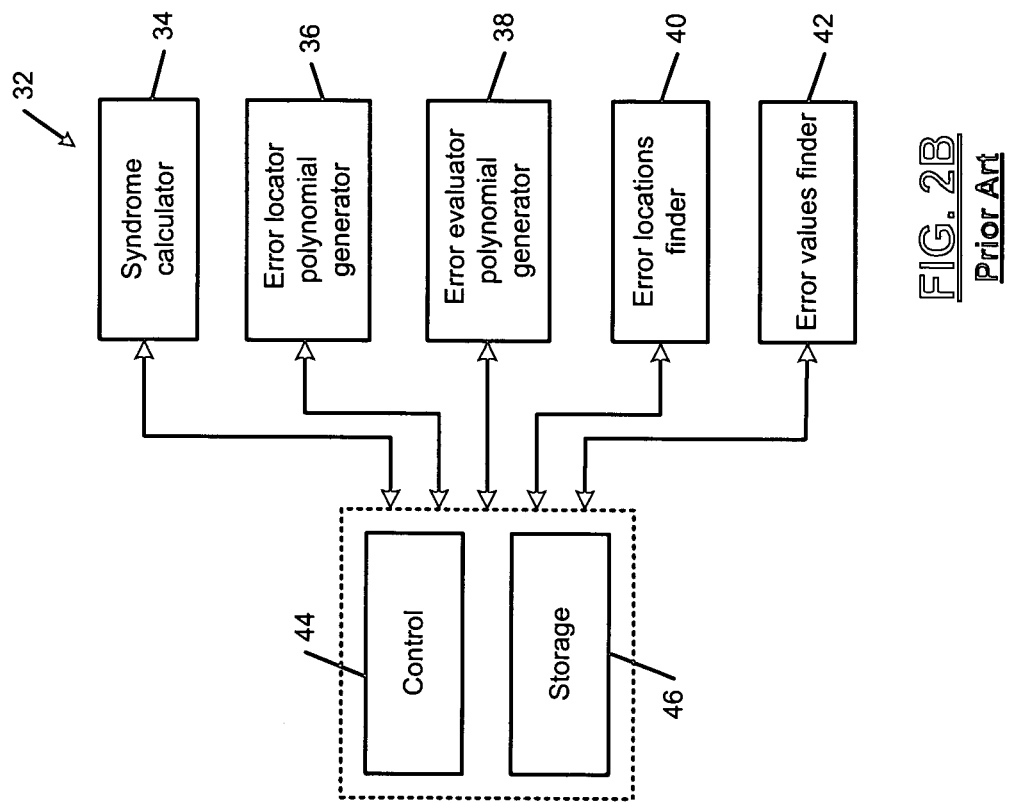
FIG. 2B is a functional block diagram of a RS decoder according to the prior art.
Figure 2A:
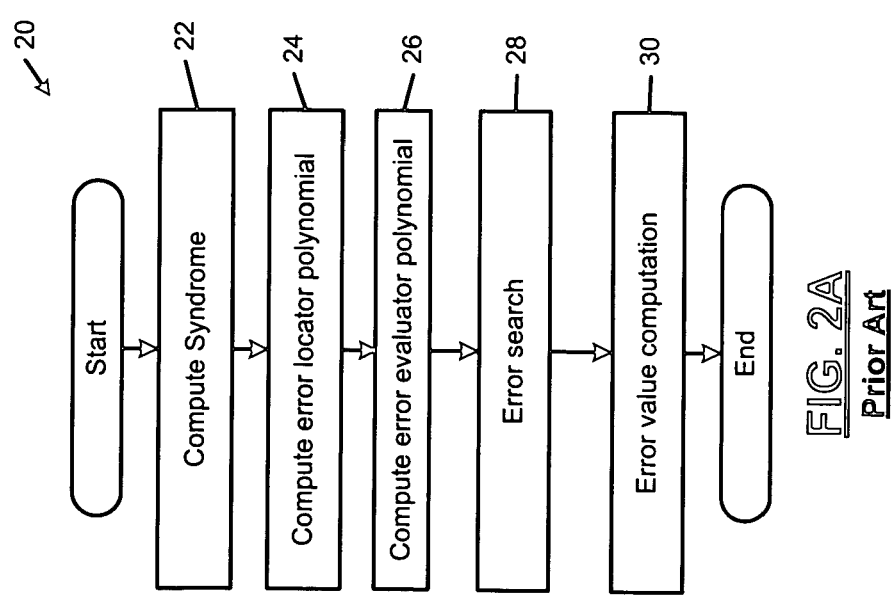
FIG. 2A illustrates steps for RS decoding according to the prior art.
Figure 3:
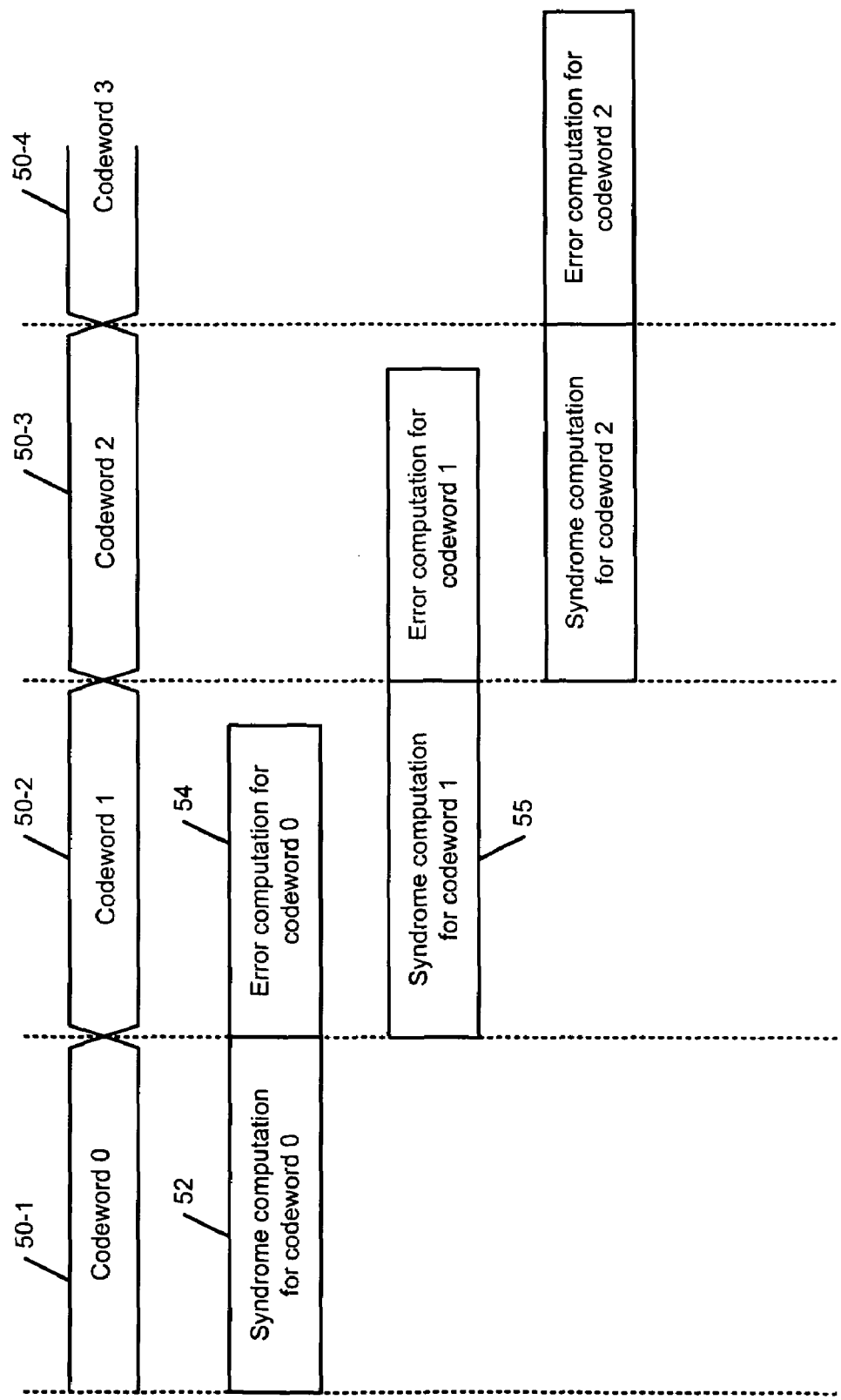
FIG. 3 illustrates pipelining of the Reed-Solomon decoder according to the prior art.
Figure 4:
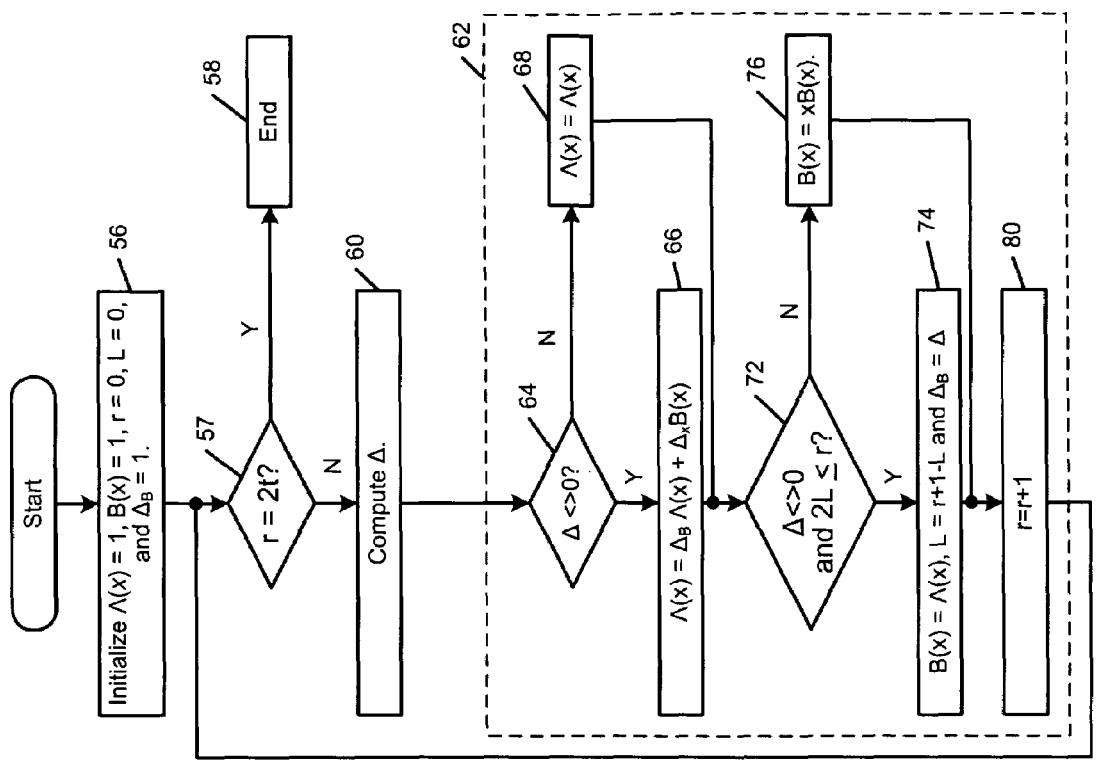
FIG. 4 illustrates steps of an inversionless Berlekamp-Massey algorithm (iBMA) according to the prior art.
Figure 5A:
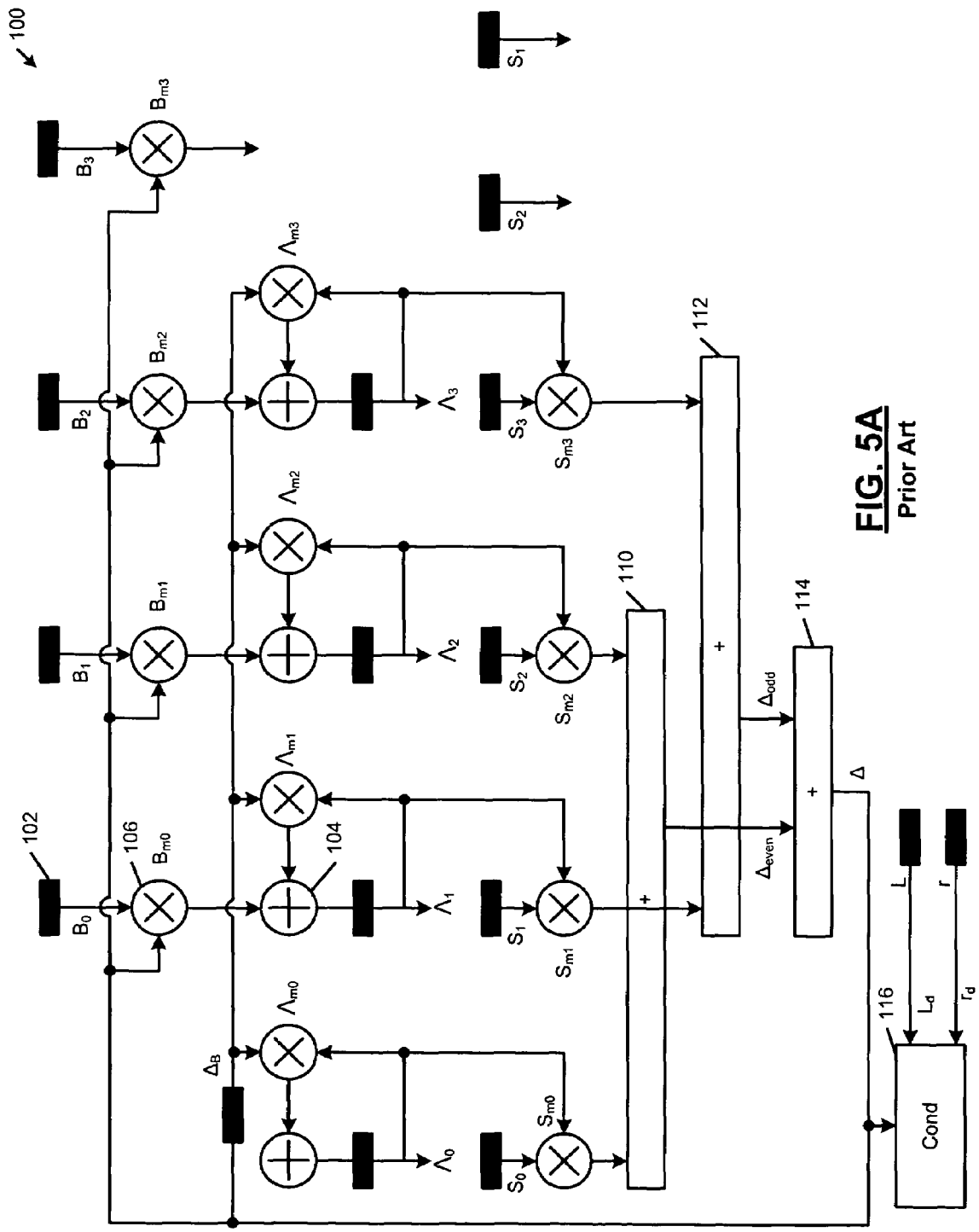
FIG. 5A is an electrical schematic of an iBMA circuit for a Reed-Solomon decoder according to the prior art.

After the 2t iterations of the iBMA, the $\Lambda(x)$ coefficients values are ready to be used in Chien's search to find error locations. At the same time, error values can be computed using Forney's algorithm. The error values can also be computed using "Error Evaluator for Inversionless Berlekamp-Massey Algorithm In Reed-Solomon Decoders", Feng et al. Ser. No. 10/304,511, filed Nov. 26, 2002 which was based on U.S. Provisional Application No. 60/371,898, filed Apr. 11, 2002 and which are both hereby incorporated by reference in their entirety. When there is no erasure, Feng's evaluation can be used to simplify the computation. In other words, the error evaluator polynomial generator 38 in FIG. 2B and step 26 in FIG. 2A can be omitted. This method avoids calculating the traditional error evaluator polynomial $\Omega(x)$.

$$\frac{\Lambda_0 \Delta_B x^{b+2t-1}}{xB(x)\Lambda'(x)}$$

Both equations are evaluated at $\alpha^{-1}$ for the error value, where $\Lambda'(x)$ is the formal derivative of $\Lambda(x)$, and $B(x)$ is the scratch polynomial used in the iBMA algorithm.

Figure 9:
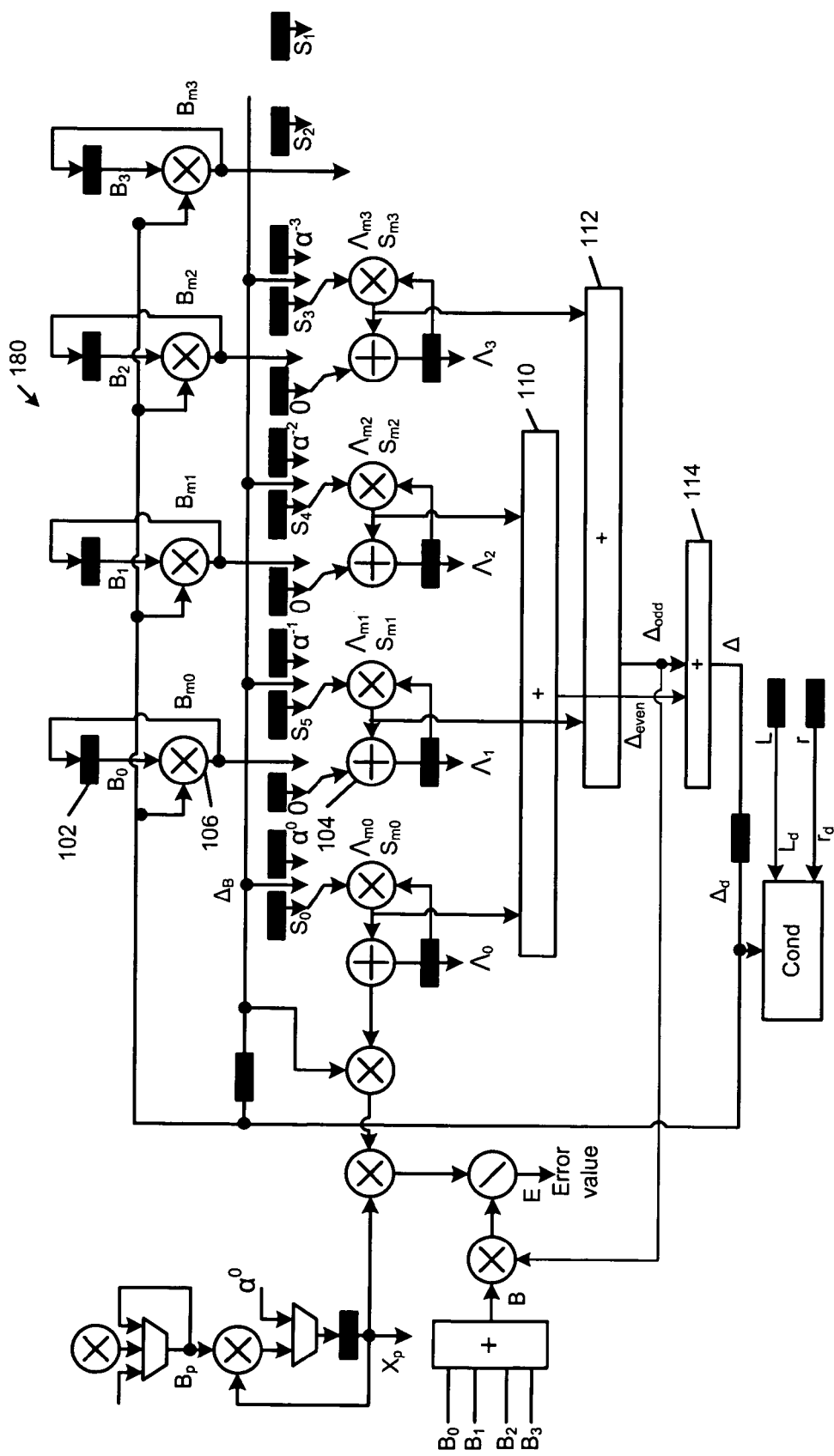
FIG. 9 is an electrical schematic of the shared circuit of an iBMA algorithm, an error location finder and an error value calculation circuit (Feng) for a Reed-Solomon decoder according to the present invention.

To reduce circuit area, the pipelined iBMA algorithm, Chien's search and the error value computation can share the same circuitry. Referring to FIG. 9, a shared circuit 180 using the algorithm disclosed in Feng et al. as the error value calculation method is shown.

After the 2t iBMA iterations, the $\Lambda(x)$ coefficients values are stored in registers $\Lambda_0$, $\Lambda_1$, $\Lambda_2$, and $\Lambda_3$. To evaluate $\Lambda(x)$ at 1, $\alpha^{-1}$, $\alpha^{-2}$, ..., $\alpha^{-(n-1)}$, the multipliers $S_{m0}$, ..., $S_{m3}$ and adders $A_0$, ..., $A_3$ in FIG. 9 are used. In this mode, the multipliers $S_{m0}$, ..., $S_{m3}$ inputs are switched to 1, $\alpha^{-1}$, $\alpha^{-2}$, ..., $\alpha^{-2}$, ... and the adders $A_0$, ..., $A_3$ inputs are switched to zero. The signal $\Delta$ is the evaluation of $\Lambda(x)$ at 1, $\alpha^{-1}$, $\alpha^{-2}$, ..., $\alpha^{-(n-1)}$. The signal $\Delta_{odd}$ is the evaluation of $x\Lambda'(x)$ at 1, $\alpha^{-1}$, $\alpha^{-2}$, ..., $\alpha^{-(n-1)}$. Similarly, the value of $B(x)$ evaluated at 1, $\alpha^{-1}$, $\alpha^{-2}$, ..., $\alpha^{-(n-1)}$ are output at B. The evaluation of the error values is provided at E.

Figure 10:
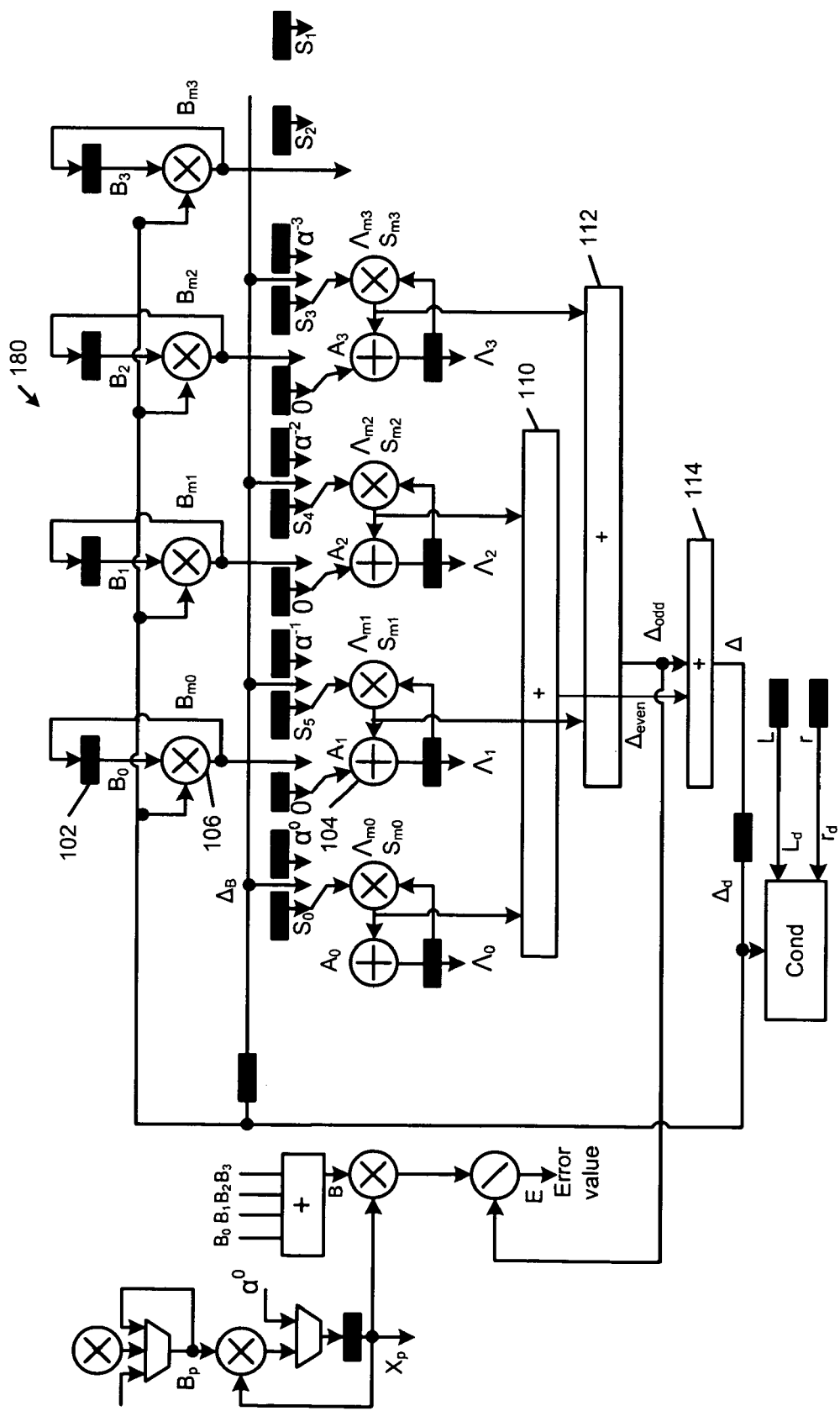
FIG. 10 is an electrical schematic of the shared circuit of an iBMA algorithm, an error location finder and an error value calculation circuit (Forney) for a Reed-Solomon decoder according to the present invention.

Alternately, if Forney's algorithm is used, the $\Omega(x)$ coefficients can be computed by $\Omega(x)=\Lambda(x)S(x) \bmod x^{2t}$ by using the multipliers $\Lambda_{m0}$, $\Lambda_{m1}$, $\Lambda_{m2}$, and $\Delta_{m3}$ and the adders 110, 112 and 114. The $B(x)$ registers are used to store the $\Omega(x)$ coefficients values. The iBMA and error value calculation algorithms share the hardware, as shown in FIG. 10.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A Reed-Solomon decoder, comprising:
an inversionless Berlekamp-Massey algorithm (iBMA) circuit that includes:
    a first polynomial generator that generates an error locator polynomial,
    a discrepancy generator that generates discrepancy values that are output to said first polynomial generator, and
    a plurality of arithmetic units, wherein said arithmetic units are used by said discrepancy generator during a first time period to generate said discrepancy values and said arithmetic units are used during a second time period by said first polynomial generator to generate said error locator polynomial.

2. The Reed-Solomon decoder of claim 1 further comprising a syndrome calculating circuit that generates syndromes that are output to said iBMA circuit.

3. The Reed-Solomon decoder of claim 1 further comprising an error location finder circuit that communicates with said iBMA circuit and that identifies error locations.

4. The Reed-Solomon decoder of claim 3 wherein said error location finder circuit implements Chien's search.

5. The Reed-Solomon decoder of claim 3 further comprising an error value computation circuit that communicates with said iBMA circuit and that generates error values.

6. The Reed-Solomon decoder of claim 5 wherein said error value computation circuit implements Forney's algorithm.

7. The Reed-Solomon decoder of claim 5 wherein said error value computation circuit implements Feng's algorithm.

8. The Reed-Solomon decoder of claim 1 wherein said iBMA circuit completes one iteration every two clock cycles and wherein said first time period corresponds to one of said two clock cycles and said second time period corresponds to the other of said two clock cycles.

9. The Reed-Solomon decoder of claim 1 further comprising:
a scratch polynomial generator that generates a scratch polynomial; and
a second delay circuit that communicates with an output of said scratch polynomial generator, wherein said discrepancy generator calculates said discrepancy values over two clock cycles.

10. The Reed-Solomon decoder of claim 1 further comprising:
a scratch polynomial generator that generates a scratch polynomial;
a first delay circuit that delays said discrepancy values; and
a feedback loop that feeds back said delayed discrepancy values to said first polynomial generator and said scratch polynomial generator.

11. The Reed-Solomon decoder of claim 5 wherein said iBMA circuit is integrated with at least one of said error location finder circuit and said error value computation circuit and wherein hardware sharing occurs between said iBMA circuit and said at least one of said error location finder circuit and said error value computation circuit.

12. A Reed-Solomon decoder, comprising:
a syndrome calculating circuit that calculates syndrome values;
an inversionless Berlekamp-Massey algorithm (iBMA) circuit that includes an first polynomial generator that generates an error locator polynomial, a discrepancy generator that generates discrepancy values that are output to said first polynomial generator, and a plurality of arithmetic units,
wherein said arithmetic units are used by said discrepancy generator during a first time period to generate said discrepancy values and said arithmetic units are used during a second time period by said first polynomial generator to generate said error locator polynomial;
an error location finder circuit that communicates with said iBMA circuit and that identifies error locations; and
an error value computation circuit that communicates with said iBMA circuit and that generates error values.

13. The Reed-Solomon decoder of claim 12 wherein said iBMA circuit completes one iteration every two clock cycles and wherein said first time period corresponds to one of said two clock cycles and said second time period corresponds to the other of said two clock cycles.

14. The Reed-Solomon decoder of claim 12 further comprising:
a scratch polynomial generator that generates a scratch polynomial; and
a second delay circuit that communicates with an output of said scratch polynomial generator, wherein said discrepancy generator calculates said discrepancy values over two clock cycles.

15. A Reed-Solomon decoder, comprising:
an inversionless Berlekamp-Massey algorithm (iBMA) circuit that includes:
    first polynomial generating means for generating an error locator polynomial,
    discrepancy generating means that generates discrepancy values that are output to said first polynomial generating means, and
    arithmetic means for operating on inputs thereto, wherein said arithmetic means is used by said discrepancy generating means during a first time period to generate said discrepancy values and said arithmetic means is used during a second time period by said first polynomial generating means to generate said error locator polynomial.

16. The Reed-Solomon decoder of claim 15 further comprising syndrome calculating means for generating syndrome values that are output to said iBMA circuit.

17. The Reed-Solomon decoder of claim 15 further comprising error location finder means that communicates with an output of said iBMA circuit for identifying error locations.

18. The Reed-Solomon decoder of claim 17 wherein said error location finder means implements Chien's search.

19. The Reed-Solomon decoder of claim 17 further comprising error value computation means that communicates with said iBMA circuit for computing error values.

20. The Reed-Solomon decoder of claim 19 wherein said error value computation means implements Forney's algorithm.

21. The Reed-Solomon decoder of claim 19 wherein said error value computation means implements Feng's algorithm.

22. The Reed-Solomon decoder of claim 15 wherein said iBMA circuit completes one iteration every two clock cycles and wherein said first time period corresponds to one of said two clock cycles and said second time period corresponds to the other of said two clock cycles.

23. The Reed-Solomon decoder of claim 15 further comprising:
scratch polynomial generating means for generating a scratch polynomial; and
second delay means that communicates with an output of said scratch polynomial generating means for providing an additional delay, wherein said discrepancy generating means calculates said discrepancy values over two clock cycles.

24. The Reed-Solomon decoder of claim 15 further comprising:
scratch polynomial generating means for generating a scratch polynomial;
a first delay means for delaying said discrepancy values; and
feedback means for feeding said delayed discrepancy values back to said first polynomial generator and said scratch polynomial generating means.

25. The Reed-Solomon decoder of claim 19 wherein said iBMA circuit is integrated with at least one of said error location finder means and said error value computation means.

26. A Reed-Solomon decoder, comprising:
syndrome calculating means for calculating syndrome values;
an inversionless Berlekamp-Massey algorithm (iBMA) circuit that communicates with said syndrome calculating means and that includes first polynomial generating means for generating an error locator polynomial, discrepancy generating means that generates discrepancy values that are output to said first polynomial generating means, and arithmetic means for operating on inputs thereto, wherein said arithmetic means is used by said discrepancy generating means during a first time period to generate said discrepancy values and said arithmetic means is used during a second time period by said first polynomial generating means to generate said error locator polynomial; and
error location finder means that communicates with said iBMA circuit for identifying error locations; and
error value computation means that communicates with said iBMA circuit for generating error values.

27. The Reed-Solomon decoder of claim 26 wherein said iBMA circuit completes one iteration every two clock cycles and wherein said first time period corresponds to one of said two clock cycles and said second time period corresponds to the other of said two clock cycles.

28. The Reed-Solomon decoder of claim 26 further comprising:
scratch polynomial generating means for generating a scratch polynomial;
first delay means for delaying said discrepancy values; and
feedback means for feeding back said delayed discrepancy values to said first polynomial generating means and said scratch polynomial generating means.

29. A method of operating a Reed-Solomon decoder, comprising:
performing an inversionless Berlekamp-Massey algorithm (iBMA) algorithm by:
generating an error locator polynomial using a first polynomial generator,
generating discrepancy values for said error locator polynomial;
using arithmetic units for generating said discrepancy values during a first time period; and
using said arithmetic units for generating said error locator polynomial during a second time period.

30. The method of claim 29 further comprising generating syndrome values that are output to said iBMA algorithm.

31. The method of claim 29 further comprising identifying error locations.

32. The method of claim 31 wherein said error locations are generated using Chien's search algorithm.

33. The method of claim 31 further comprising computing error values.

34. The method of claim 33 wherein said error values are computed using Forney's algorithm.

35. The method of claim 34 wherein said error values are computed using Feng's algorithm.

36. The method of claim 29 wherein said iBMA circuit completes one iteration every two clock cycles and wherein said first time period corresponds to one of said two clock cycles and said second time period corresponds to the other of said two clock cycles.

37. The method of claim 29 further comprising providing additional delays, wherein said discrepancy values are calculated over two clock cycles.

38. The method of claim 29 further comprising:
generating a scratch polynomial using a scratch polynomial generator;
delaying said discrepancy values; and
feeding back said delayed discrepancy values to said first polynomial generator and said scratch polynomial generator.

39. A method of operating a Reed-Solomon decoder, comprising:
calculating syndrome values;
performing an inversionless Berlekamp-Massey algorithm (iBMA) by:
generating an error locator polynomial,
generating discrepancy values for said error locator polynomial based on said syndrome values,
using arithmetic units to generate said discrepancy values during a first time period; and
using said arithmetic units to generate said error locator polynomial during said second time period;

identifying error locations based on said error locator polynomial; and generating error values based on said error locator polynomial.

40. The method of claim 39 wherein said iBMA algorithm completes one iteration every two clock cycles and wherein said first time period corresponds to one of said two clock cycles and said second time period corresponds to the other of said two clock cycles.

41. The method of claim 39 further comprising:

generating a scratch polynomial using a scratch polynomial generator;

delaying said discrepancy values; and feeding back said delayed discrepancy values to said first polynomial generator and said scratch polynomial generator.

* * * * *

UNITED STATES PATENT AND TRADEMARK OFFICE
CERTIFICATE OF CORRECTION

PATENT NO. : 7,322,004 B2  Page 1 of 1
APPLICATION NO. : 11/407436
DATED : January 22, 2008
INVENTOR(S) : Zhan Yu et al.

It is certified that error appears in the above-identified patent and that said Letters Patent is hereby corrected as shown below:

Title Page item [57] Abstract line 7    Delete "are" after "units"
Column 3, Line 45    Delete "$\Lambda(a^{-i})$" and insert -- $\Lambda(\alpha^{-i})$ --
Column 3, Line 47    Delete "$\Lambda(a^{-i})$" and insert -- $\Lambda(\alpha^{-i})$ --
Column 3, Line 65    Delete "A" and insert -- $\Lambda$ --
Column 4, Line 13-14    Delete all occurrences of "$\Delta$" and insert -- $\Lambda$ --
Column 5, Line 53    Delete "BMA" and insert -- iBMA --
Column 7, Line 9    Delete second occurrence of "$\alpha^{-2}, ...$"
Column 7, Line 17    Delete "$\Delta_{m3}$" and insert -- $\Lambda_{m3}$ --
Column 8, Line 26    Delete "an" and insert -- a --
Column 10, Line 18    Delete second occurrence of "algorithm"

Signed and Sealed this

Second Day of February, 2010

David J. Kappos
*Director of the United States Patent and Trademark Office*